(12) United States Patent
Saiki et al.

(10) Patent No.: US 7,061,295 B2
(45) Date of Patent: Jun. 13, 2006

(54) RING OSCILLATOR FOR DIGITAL MULTILEVEL NON-VOLATILE MEMORY

(75) Inventors: William John Saiki, Mountain View, CA (US); Hieu Van Tran, San Jose, CA (US); Sakhawat M. Khan, Los Altos, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/991,301

(22) Filed: Nov. 16, 2004

(65) Prior Publication Data

US 2005/0088221 A1    Apr. 28, 2005

Related U.S. Application Data

(62) Division of application No. 10/044,273, filed on Jan. 10, 2002, now Pat. No. 6,867,638.

(51) Int. Cl.
    *G06F 1/04* (2006.01)
(52) U.S. Cl. .......................................... 327/295; 331/57
(58) Field of Classification Search ................ 327/291, 327/295, 536; 331/57
    See application file for complete search history.

(56) References Cited

U.S. PATENT DOCUMENTS

| | | | |
|---|---|---|---|
| 4,853,654 A * | 8/1989 | Sakurai ........................ | 331/57 |
| 5,331,295 A * | 7/1994 | Jelinek et al. ................. | 331/57 |
| 5,589,761 A | 12/1996 | Nelson et al. | |
| 5,592,115 A | 1/1997 | Kassapian | |
| 5,717,318 A | 2/1998 | Matsuda et al. | |
| 5,994,933 A * | 11/1999 | Yamanaka et al. .......... | 327/158 |
| 6,211,744 B1 * | 4/2001 | Shin ............................. | 331/57 |
| 6,225,857 B1 | 5/2001 | Brokaw | |
| 6,285,622 B1 | 9/2001 | Haraguchi et al. | |
| 6,297,687 B1 | 10/2001 | Sugimura | |
| 6,359,500 B1 | 3/2002 | Zanuccoli et al. | |
| 6,414,522 B1 * | 7/2002 | Nguyen et al. .............. | 327/101 |
| 6,496,055 B1 | 12/2002 | Li | |
| 6,573,780 B1 | 6/2003 | Lin et al. | |
| 6,756,839 B1 | 6/2004 | Hall et al. | |
| 6,809,603 B1 * | 10/2004 | Ho ............................... | 331/57 |

* cited by examiner

Primary Examiner—Jeffrey Zweizig
(74) Attorney, Agent, or Firm—DLA Piper Rudnick Gray Cary US LLP

(57) ABSTRACT

An oscillator that can be used within a high voltage generation and regulation system for non-volatile memory. The system may comprise a charge pump that may have at least one pump and an oscillator. In one aspect the oscillator provides clock signals to the pump. The output of the oscillator may be disabled without turning off the clock generation. The oscillator may be a ring oscillator. In one aspect, the ring oscillator and the output stage may comprise inverters with a capacitor coupled to the output of the inverter. In one aspect, the ratio of the capacitors in the ring oscillator to the capacitor in the output stage determine the phase shift between the two clock signals. In another aspect, the capacitance of the capacitors are identical and a bias applied the ring oscillator and the output stage are radioed to adjust the phase between the two clock signals.

5 Claims, 12 Drawing Sheets

RING OSCILLATOR FOR DIGITAL MULTILEVEL NON-VOLATILE MEMORY

This application is a divisional application of U.S. patent application Ser. No. 10/044,273 filed on Jan. 10, 2002, now U.S. Pat. No. 6,867,638, the subject matter of which is incorporated herein by reference.

BACKGROUND OF THE INVENTION

The invention relates to a high voltage signal generator and regulator, and more particularly to a high voltage signal generator and regulator for a memory, such as a digital multilevel nonvolatile memory.

A conventional mixed mode integrated circuit system frequently uses different voltage supplies. Analog signal processing, such as amplification, comparison, pulse generation, may be performed at high voltage. A FLASH memory applies an erase signal and a program signal to memory cells. The erase signal and the program signal have voltage levels greater than a supply voltage. Also in multilevel volatile memories, the variation of the voltage level of the program signal falls in a smaller range for the multibit signals stored in the memory cells.

SUMMARY OF THE INVENTION

The present invention provides a high voltage generation and regulation system that generates at least one voltage signal having a voltage level greater than the supply voltage. The system may comprise a charge pump, a loop regulator, and a nested loop regulator. The charge pump may comprise at least one pump and an oscillator.

In one aspect, the oscillator provides clock signals to the at least one pump. The output of the oscillator may be disabled without turning off the clock generation. The oscillator may be a ring oscillator. In one aspect, the ring oscillator and the output stage may comprise inverters with a capacitor coupled to the output of the inverter. In one aspect, the ratio of the capacitors in the ring oscillator to the capacitor in the output stage determine the phase shift between the two clock signals. In another aspect, the capacitance of the capacitors are identical and a bias applied the ring oscillator and the output stage are ratioed to adjust the phase between the two clock signals.

In one aspect, the pump may include a plurality of voltage boost stages coupled in series. Each voltage boost stage generates an output signal having a voltage level higher than an input voltage applied thereto and comprises a first transistor coupled between the input of voltage and an output voltage, and a power-up assist diode to charge the input voltage applied to the voltage boost stage coupled to the output signal. The power-up assist diode also operates for forward VT (threshold voltage) canceling. The voltage boost stage may include a backward VT cancellation transistor coupled to the first transistor to substantially cancel threshold voltage of the first transistor in response to the output signal. The voltage boost stage may include a high voltage self-biasing circuit to precharge the output signal of the voltage boost stage.

The regulator may comprise a voltage regulator providing a regulated voltage signal in response to an input voltage signal and a control signal, a comparator coupled to the voltage regulator to generate the control signal in response to the regulated voltage signal, and a slew rate enhancement circuit coupled to an output of the comparator to boost the control signal in the event a regulated voltage signal has a voltage level less than a threshold voltage. The slew rate enhancement circuit may include a source follower, and may include a voltage divider that provides a divided signal to the comparator in response to the regulated voltage signal.

The nested loop regulator monitors the regulated voltage signal and disables the oscillator outputs when the voltage of the regulated voltage signal is substantially identical to a predetermined value.

BRIEF DESCRIPTION OF THE DRAWINGS

FIG. 2 is a schematic diagram of an oscillator of the charge pump of FIG. 1a.

FIG. 3 is a schematic diagram of a phase driver of the charge pump of FIG. 1a.

FIG. 5 is a schematic diagram illustrating a pump of the charge pump of FIG. 1a.

FIG. 15 is a schematic diagram illustrating a medium voltage pump generator of the charge pump of FIG. 1a.

DETAILED DESCRIPTION

Figure 1:
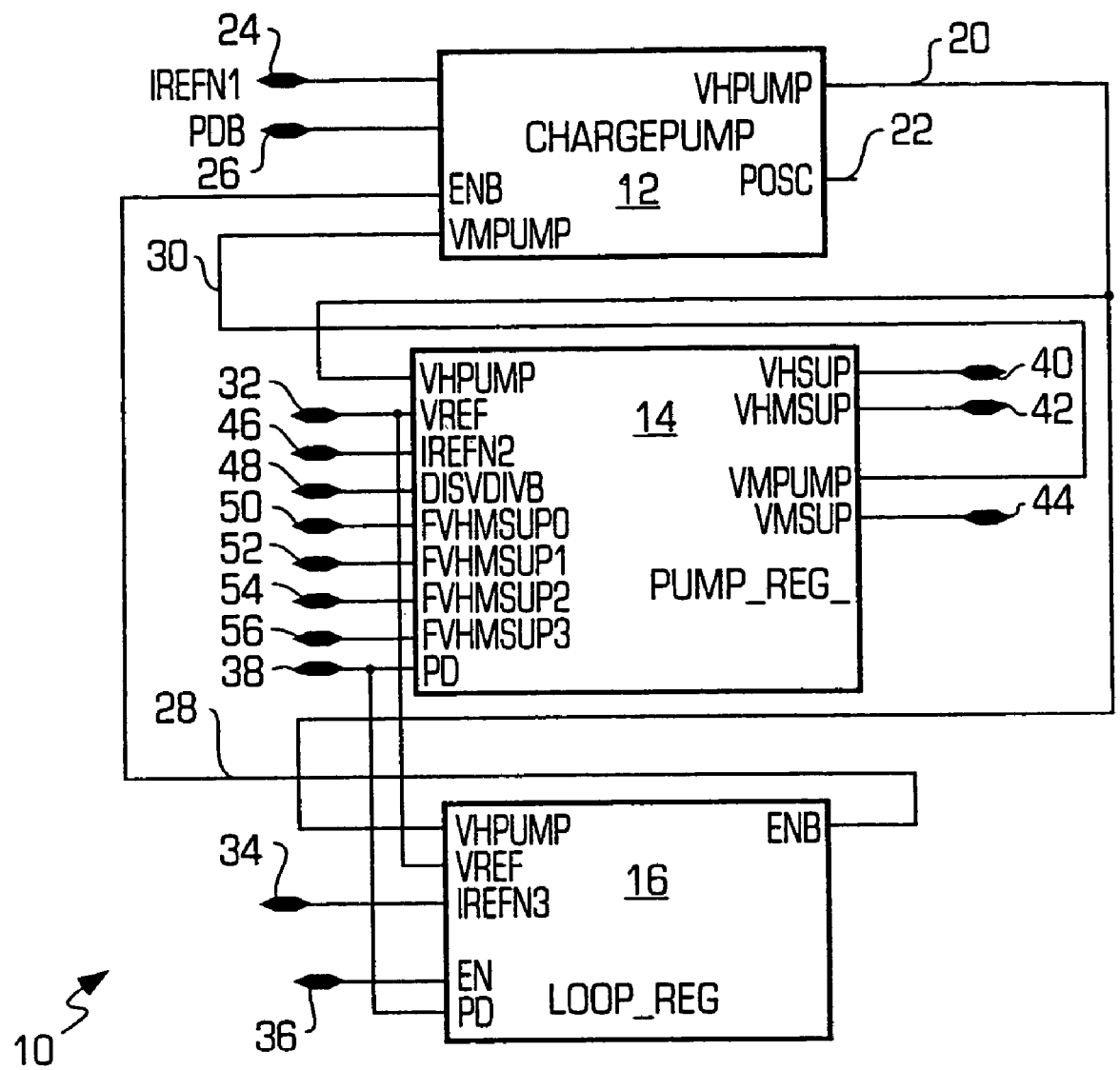
FIG. 1 is a block diagram illustrating a high voltage generation and regulation system in accordance with the present invention.

FIG. 1 is a block diagram illustrating a high voltage generation and regulation system 10 in accordance with the present invention. The high voltage generation and regulation system 10 generates a plurality of regulated power signals having different voltage levels and at voltage levels greater than a supply voltage applied to the system 10. The high voltage generation and regulation system 10 uses slew rate enhancement for decreased power up time. The high voltage generation and regulation system 10 includes nested loop regulation to achieve optimal power efficiency and high precision.

In one embodiment, the high voltage generation and regulation system 10 provides the plurality of regulated power signals to a memory device (not shown). In another embodiment, the memory device is a digital multilevel nonvolatile memory.

The high voltage generation and regulation system 10 comprises a charge pump 12, a pump regulator 14, and a loop regulator 16.

The charge pump 12 generates a high voltage pump (VHPUMP) signal 20 and an oscillator test (POSC) signal 22. The high voltage pump (VHPUMP) signal 20 is enabled in response to an enable signal (ENB) 28 from the loop regulator 16. (The ENB is enable bar, which is indicative of an active low signal). The oscillator test signal 22 provides a test signal to analyze the output of an oscillator 102 (see FIG. 1a) in the charge pump 12 or may be used as an input port to force an oscillator signal into the charge pump 12. A power down (PDB) signal 26 turns off the charge pump 12. A first reference (IREFN1) signal 24 from a band gap voltage circuit (not shown) provides a reference current to the charge pump 12 to adjust the bias of the oscillator 102 (see FIG. 1a). Band gap voltage circuits used in charge pump circuits and memory devices are well known in the art. A medium voltage pump (VMPUMP) signal 30 from the pump regulator 14 provides a self bias high voltage level for the charge pump 12.

The pump regulator 14 generates a plurality of regulated power signals having different voltage levels. Specifically, the pump regulator 14 generates a high voltage supply (VHSUP) signal 40, a medium high voltage supply (VHMSUP) signal 42, the medium voltage pump (VMPUMP) signal 30 and a medium voltage supply (VMSUP) signal 44 in response to the high voltage pump (VHPUMP) signal 20 from the charge pump 12. A reference voltage (VREF) signal 32 sets a reference for regulating the high voltage (VHSUP) signal 40 and the medium high voltage pump (VHMSUP) signal 42. A second reference (IREFN2) signal 46 controls the biasing of the pump regulator 14. A voltage divider disable (DISVIDB) signal 48 forms an enable/disable signal for the pump regulator 14. A plurality of voltage selection signals are applied to the pump regulator 14 for setting a divided voltage as a reference voltage for the pump regulator 14. Specifically, a first voltage selection (FVHMSUP0) signal 50, a second voltage selection (FVHMSUP1) signal 52, a third voltage selection (FVHMSUP2) signal 54, and a fourth voltage selection (FVHMSUP3) signal 56 set a multiplexer 1204 (see FIG. 12) to change the voltages of a voltage divider 1006 (see FIG. 10) to adjust the reference voltage applied to an operational amplifier 1008 (see FIG. 10). The power down (PD) signal 38 disables the pump regulator 14 during power down.

The loop regulator 16 provides nested loop regulation to control the charge pump 12. The loop regulator 16 generates the enable (ENB) signal 28 to disable the charge pump 12 in response to the high voltage pump (VHPUMP) signal 20 being above a certain threshold and the enable (EN) signal 36. The reference voltage (VREF) signal 32 sets a trigger voltage for comparing to the high voltage pump (VHPUMP) signal 20 of the loop regulator 16 to set the enable (ENB) signal 28. A third reference (IREFN3) signal 34 from a band gap voltage circuit (not shown) controls the biasing of an operational amplifier 1404 (see FIG. 14) of the loop regulator 16. The power down (PD) signal 38 disables the loop regulator 16 during power down.

Figure 1A:
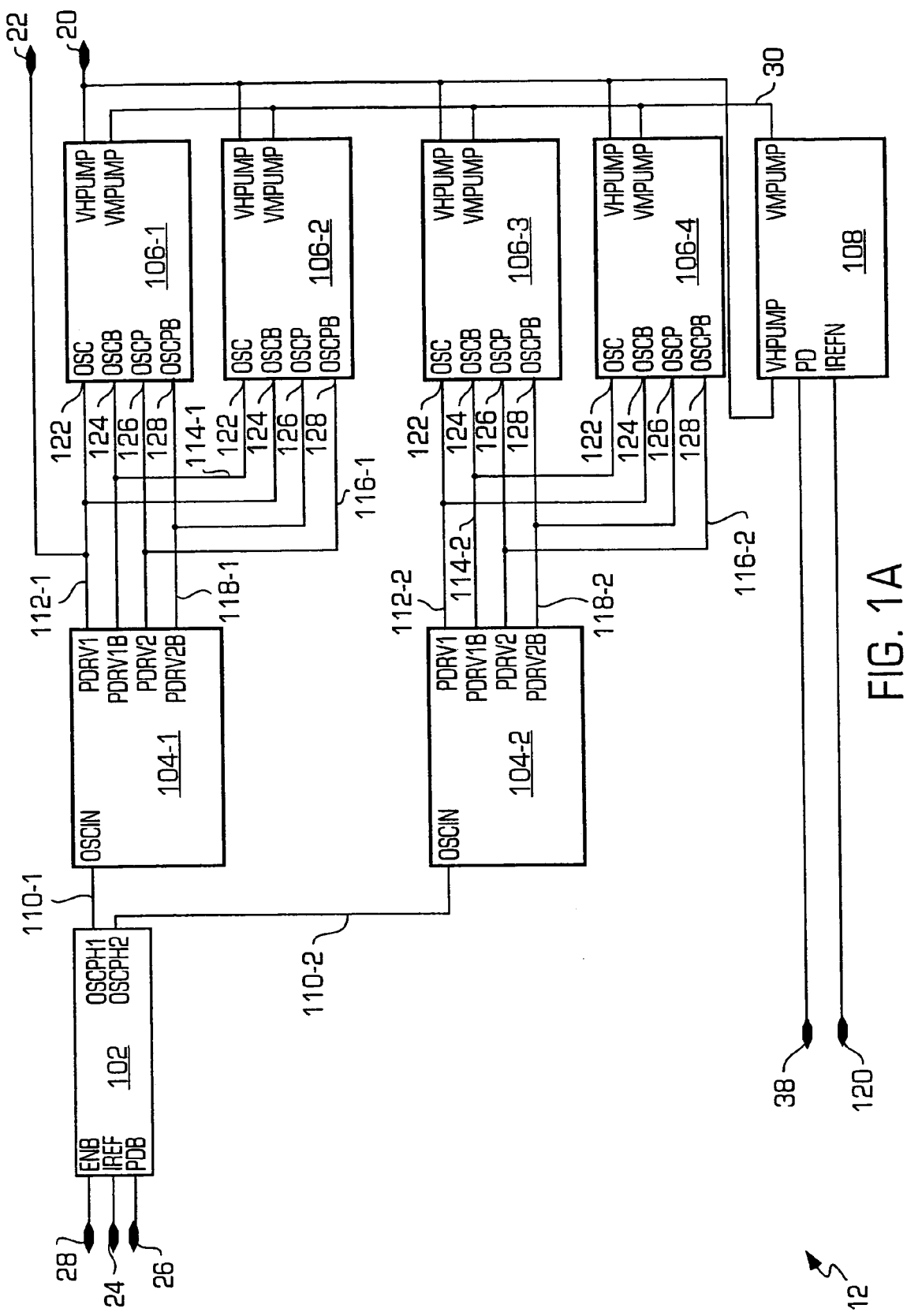
FIG. 1a is a block diagram illustrating a charge pump of the high voltage generation and regulation system of FIG. 1.

FIG. 1a is a block diagram illustrating the charge pump 12, which comprises an oscillator 102, a plurality of phase drivers 104-1 and 104-2, a plurality of pumps 106-1, 106-2, 106-3, and 106-4, and a medium voltage pump generator (VMPUMPGEN) 108. The charge pump 12 is a quadrature phase, forward and backward threshold voltage (VT) canceling, high voltage self-biasing charge pump.

The oscillator 102 provides oscillator clock signals 110-1 and 110-2 having different phases to the phase drivers 104-1, 104-2, respectively. In response, each of the phase drivers 104-1, 104-2 generates two phase clocks 112 and 114 and two non-overlapping clocks 116 and 118 to form four clock phases. The phase clocks are applied to the four pumps 106-1 through 106-4. Likewise, the non-overlapping clocks are applied to the pumps 106-1 through 106-4 to provide the VT-canceling function. Each of the four pumps 106-1 through 106-4 boosts the voltage at the rise of the clock signal, thereby producing a more continuous, lower ripple output voltage of the high voltage pump (VHPUMP) signal 20. The pumps 106 comprise multiple stages (see FIG. 5) for boosting the voltage. Each stage (see FIGS. 6, 7, 8) of the pump 106 includes a precharging, high voltage self-biased diode to preset the initial charge on a capacitor in the stage. In one embodiment, the self-biasing refers to the pumps 106 generating its own bias voltage. Each stage also includes a power up-assist diode to enable a more efficient, high speed power up without drawing additional power. The power up-assist diode also provides forward VT cancellation.

The first reference (IREFN1) signal 24 adjusts the bias for the operation of the oscillator 102. The power down (PDB) signal 26 turns off the oscillator 102 during power down. The enable (ENB) signal 28 disables the outputs of the oscillator 102.

The phase driver 104-1 provides a first phase drive clock signal 112-1 and a second phase drive clock signal 114-1 to respective input terminals 122 and 124 of the pump 106-1 and to the respective input terminals 124 and 122 of the pump 106-2. The first phase drive clock signal 112-1 is 180° from the second phase drive clock signal 114-1. The phase driver 104-1 also provides a first phase drive non-overlap clock signal 116-1 and a second phase drive non-overlap clock signal 118-1 to respective input terminals 126 and 128 of the pump 106-1 and to the respective input terminals 128 and 126 of the pump 106-2.

The phase driver 104-2 provides a first phase drive clock signal 112-2 and a second phase drive clock signal 114-2 to respective input terminals 122 and 124 of the pump 106-3 and to respective input terminals 124 and 122 of the pump 106-4. The first phase drive clock signal 112-2 is 180° out of phase from the second phase drive clock signal 114-2. The phase driver 104-2 also provides a first phase drive non-overlap clock signal 116-2 and a second phase driver non-overlap clock signal 118-2 to respective input terminals 126 and 128 of the pump 106-3 and to respective input terminals 128 and 126 of the pump 106-4. In response to the applied clock signals, the pumps 106-1, 106-2, 106-3, and 106-4 generate the high voltage pump (VHPUMP) signal 20 using the medium voltage pump (VMPUMP) signal 30 from the medium voltage pump generator (VMPUMPGEN) 108 for high voltage self bias.

The medium voltage pump generator (VMPUMPGEN) 108 generates the medium voltage pump (VMPUMP) signal 30 in response to the high voltage pump (VHPUMP) signal 20. A power down (PD) signal 38 disables the medium voltage pump generator (VMPUMPGEN) 108. A fourth reference (IREFN) signal 120 from a band gap circuit (not shown) controls the biasing of the medium voltage pump generator 108 to adjust the voltage of the medium voltage pump signal 30.

Figure 2:
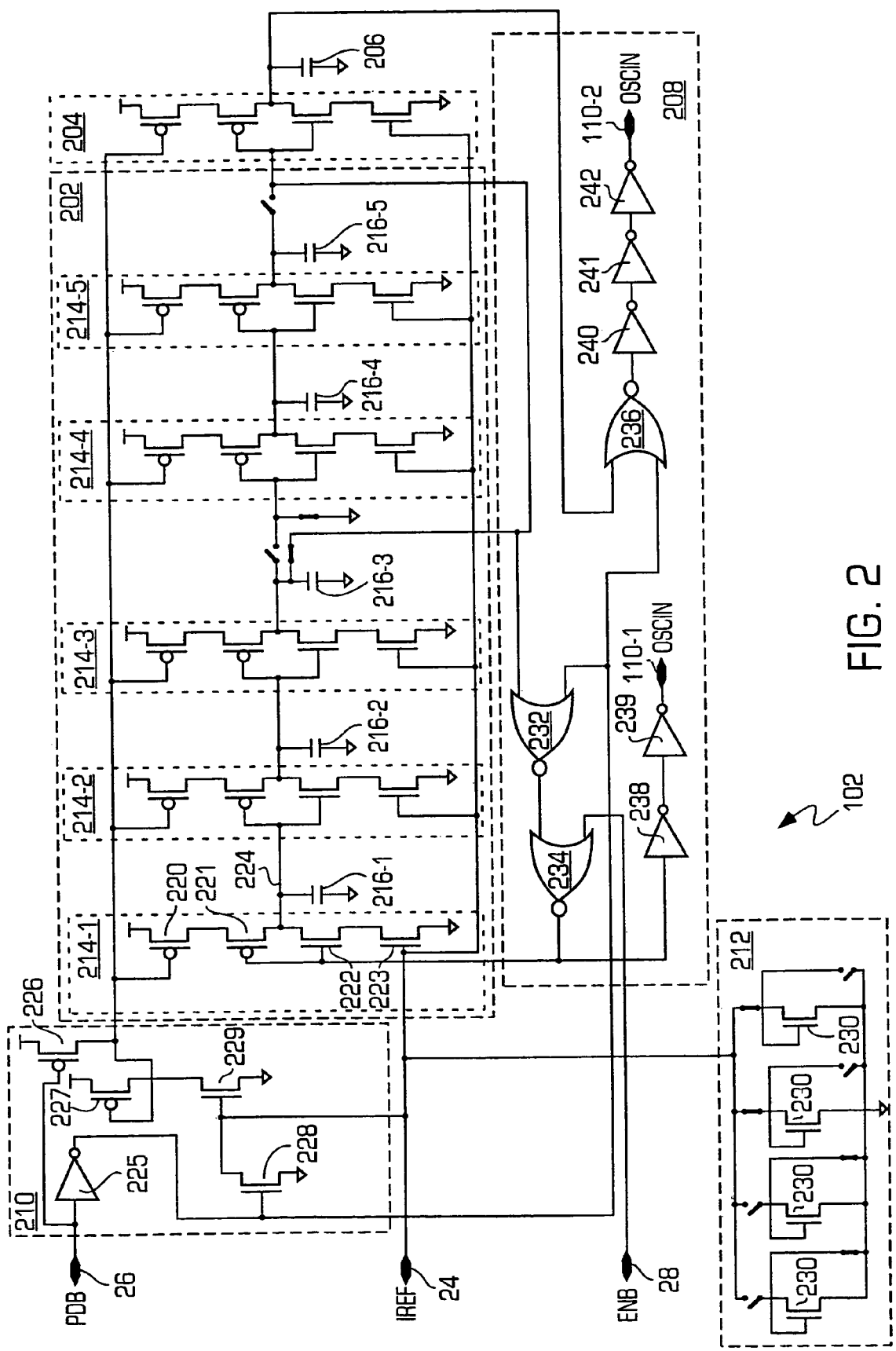

FIG. 2 is a schematic diagram of the oscillator 102. The oscillator 102 comprises a ring oscillator 202, an output inverter stage 204, an output stage capacitor 206, a multiplexer 208, a voltage control circuit 210, and a bias control circuit 212. The ring oscillator 202 comprises a plurality of oscillator inverter stages 214-1 through 214-5 and a plurality of oscillator capacitors 216-1 through 216-5. As an overview, the oscillator 102 receives an enable (ENB) signal 28 and a power down (PDB) signal 26 and provides the oscillator clock signals 110-1 and 110-2 that are 90° out of phase of each other. By controlling the current on each oscillator inverter stage 214 and the output inverter stage 204 to charge and discharge the capacitors 216 and 206, the oscillator 102 provides precise timing control of the oscillator clock signals 110.

The oscillator inverter stages 214-1 through 214-5 are connected serially as inverters with the corresponding oscillator capacitor 216-1 through 216-5, respectively, coupled between the output of the oscillator inverter stage 214-1 through 214-5 and ground. The output stage capacitor 206 is coupled between the output of the output inverter stage 209 and ground.

The output inverter stage 204 and the oscillator inverter stages 214-1 through 214-5 each comprise a pair of PMOS transistors 220, 221 and a pair of NMOS transistors 222, 223. (For clarity and simplicity of the drawings, the reference numbers for the PMOS transistor 220 and 221 and the NMOS transistors 222 and 223 are shown only for the inverter stage 214-1.) The PMOS transistors 220, 221 includes drain-source terminals coupled between a power supply voltage Vdd and an output terminal 224. The NMOS transistors 223 and 223 include drain-source terminals coupled between the output terminal 224 and ground. The gate of the PMOS transistor 220 is connected to an output of the voltage control circuit 210. The gates of the PMOS transistor 221 and the NMOS transistor 222 are coupled together to form an inverter. The gate of the NMOS transistor 223 is coupled to the first reference (IREF) signal 24 which provides a current bias and also is coupled to the bias control circuit 212.

The bias control circuit 212 includes a plurality of diode connected NMOS transistors 230 that are coupled together in parallel between the first reference (IREF) signal 24 and ground. The number of diode connected NMOS transistors 230 are selectable.

The power down (PDB) signal 26 enables the voltage control circuit 210 to provide an enable signal to the output inverter stage 204 and the plurality of oscillator inverter stages 214-1 through 214-5. The voltage control circuit 210 comprises an inverter 225, PMOS transistors 226, 227, and NMOS transistors 228, 229. Both the PMOS transistors 226, 227 include drain-source terminals coupled between the power supply Vdd and the output terminal of the voltage control circuit 210. The PMOS transistor 226 includes a gate enabled by the power down (PDB) signal 26. The PMOS transistor 227 is diode connected with a gate and drain coupled together. The inverter 225 inverts the power down (PDB) signal 26 and applies it to the gate of the NMOS transistor 228, which includes drain-source terminals coupled between the common node formed of the gate of the NMOS transistor 229 and the first reference (IREF) signal 24, and ground. During power down, the NMOS transistor 228 is turned on to ground the gate and the first reference (IREF) signal 24, and the NMOS transistor 229 is turned off.

The multiplexer 208 is coupled between the output of the ring oscillator 202 and the input of the ring oscillator 202. The output of the output inverter stage 204 which is filtered by the output stage capacitor 206 to ground is applied to another input to the multiplexer 208. The multiplexer 208 provides the oscillator clock signals 110-1 and 110-2. The multiplexer 208 comprises NOR gates 232, 234, 236, and inverters 238 through 242. The enable (ENB) signal 28 disables the output of the multiplexer 208 and disables the running of the ring oscillator 202. In another embodiment, the ring oscillator 202 does not disable the ring oscillator 202.

The output inverter stage 204 and the output stage capacitor 206 provide precise generation of the phase shift of the oscillator clock signals 110-1 and 110-2. In one embodiment, the current control into the output inverter stage 204 is substantially identical as to the current control of the oscillator inverter stages 214-1 through 214-5. The degree of phase shift may be controlled by the ratio of the capacitance of the output stage capacitor 206 and the oscillators 216-1 through 216-5. In another embodiment, the capacitance of the output stage capacitor 206 may be the same as the capacitance of the oscillator capacitors 216-1 through 216-5 and the degree of phase shift may be controlled by the ratio of the bias current applied to the oscillator inverter stages 214-1 through 214-5 to the bias current of the output inverter stage 204.

Figure 3:
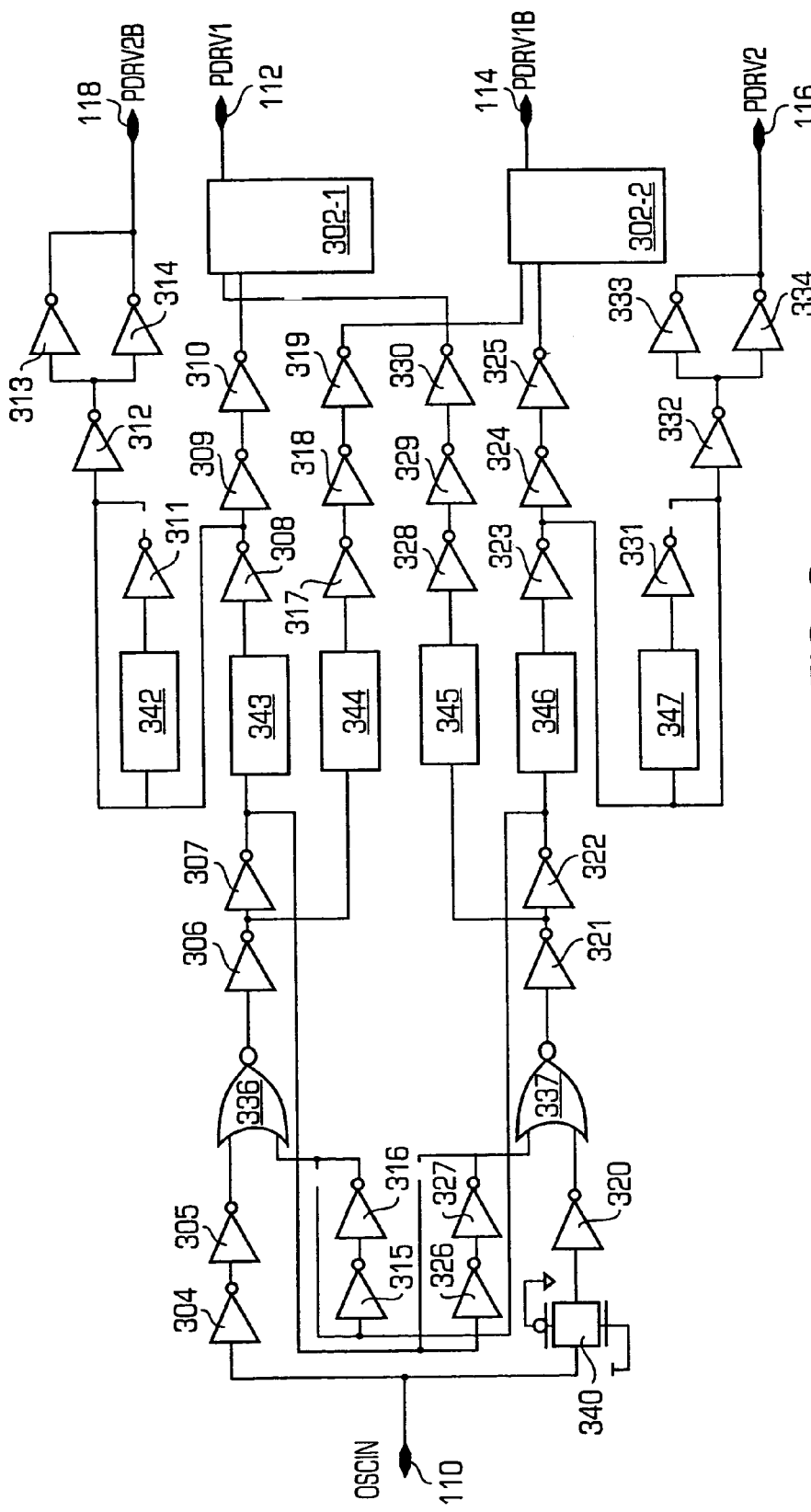

FIG. 3 is a schematic diagram of the phase driver 104 of the charge pump 12. As an overview, the phase driver 104 receives clock signals from the oscillator 102 and generates two clock signals 180° from each other, and two non-overlapping clocks for each of the first two clocks. These clock signals drive voltage boost stages in the pump 106, described below in conjunction with FIG. 5. The non-overlapping clocks 116 and 118 enable the Vt-cancellation in the voltage boost stages.

The phase driver 104 comprises phase buffers 302-1 and 302-2, a plurality of inverters 304 through 334, a plurality of NOR gates 336 and 337, a transfer gate 340, and a plurality of delay circuits 342 through 347. The delay circuits are of the same circuit topology for delay tracking. For example, the delay circuits are biased on R-C. The oscillator clock signal 110 is applied to the inverter 304 and the transfer gate 340. A first signal path is through the inverters 304 through 310, the NOR gate 336, and the delay circuit 343 to the phase buffer 302-1. A second signal path branches from the inverter 308 of the first signal path (alternatively through the delay circuit 342 and the inverters 311) through inverters 312–314 to generate the second phase drive non-overlap clock signal 118. A third signal path branches from the inverter 306 of the first signal path through the delay circuit 344 and the inverters 317 through 319 to the phase buffer 302-2.

A fourth signal path is through the transfer gate 340, the inverters 320 through 325, the NOR gate 337 and the delay circuit 346 to the phase buffer 302-2, which generates the second phase drive clock signal 114. A first feedback path from the inverter 322 is delayed by the inverters 315 and 316 and applied to the NOR gate 336 of the first signal path. A second feedback path from the inverter 307 of the first signal path is delayed by the inverters 326 and 327 and applied to the NOR gate 337 of the fourth signal path. A fifth signal path branches from the inverter 323 of the fourth signal path (alternatively through the delay circuit 347 and the inverters 331) through inverters 332–334 to generate the first phase drive non-overlap clock signal 116. A sixth signal path branches from the inverter 321 of the fourth signal path through the delay circuit 345 and the inverters 328 through 330 to the phase buffer 302-1.

Figure 4:
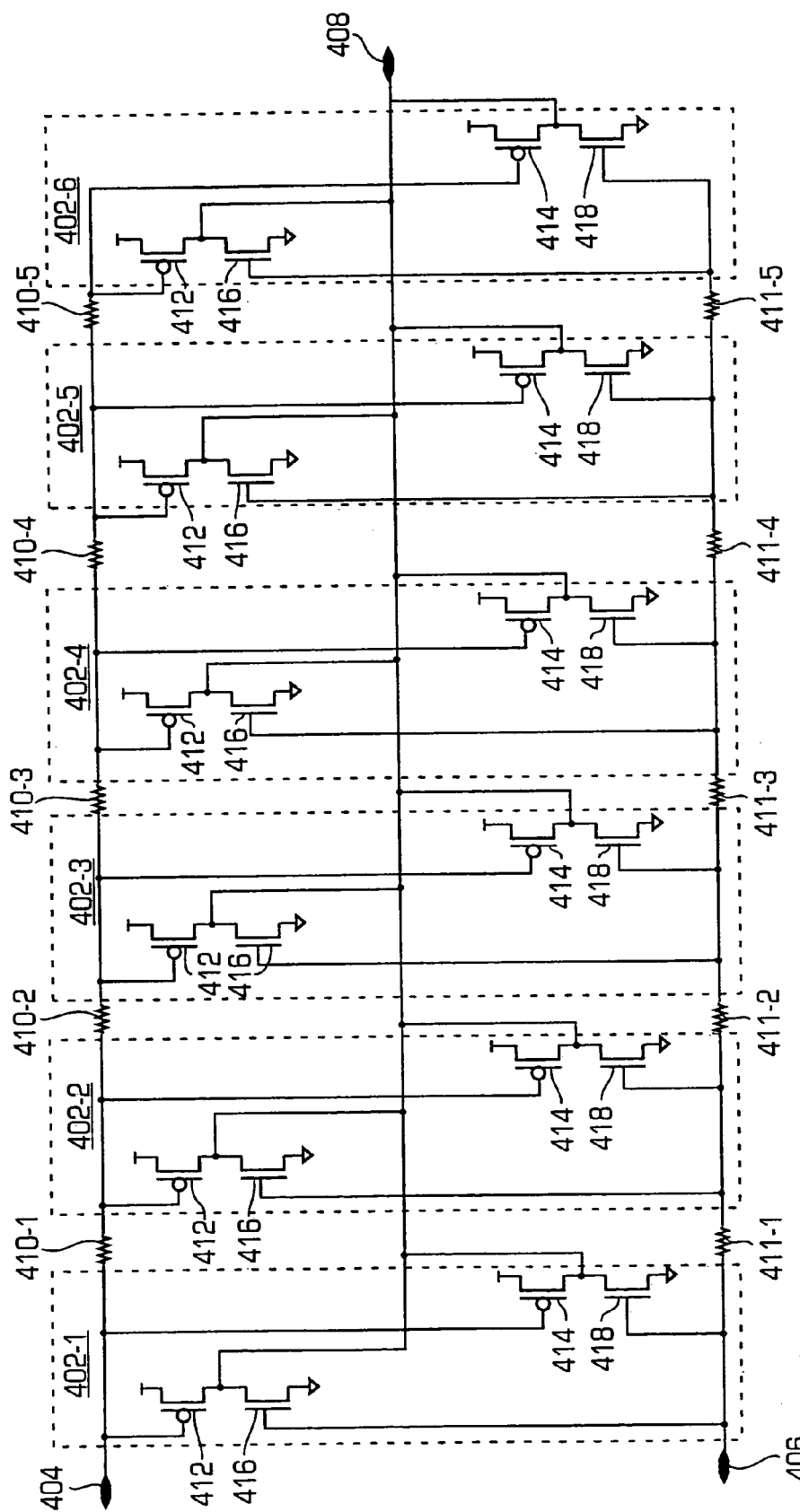
FIG. 4 is a schematic diagram illustrating a phase buffer of the phase driver of FIG. 3.

FIG. 4 is a schematic diagram illustrating the phase buffer 302 of the phase driver 104 of FIG. 3. The phase buffer 302 comprises a plurality of driving stage circuits 402-1 through 402-6 coupled between a phase B signal line 404 and a phase signal line 406. The output of each driving stage circuit 402-1 through 402-6 is coupled to an output signal line 408. For the phase buffer 302-1, the phase B signal line 404 receives the output of the inverter 330, and the phase signal line 406 receives the output of the inverter 310. The output signal line 408 provides the first phase drive clock signal 112. For the phase buffer 302-2, the phase B signal line 404 receives the output of the inverter 310, and the phase signal line 406 receives the output of the inverter 325. The output signal line 408 provides the second phase drive clock signal 114.

The phase B signal line 404 comprises a plurality of resistors 410-1 through 410-5 connected in series. The phase signal line 406 comprises a plurality of resistors 411-1 through 411-5 connected in series. The driving stage circuits 402-1 through 402-5 are coupled to the phase B signal line 404 in front of the respective resistor 410-1 through 410-5, and coupled to the phase signal line 406 in front of the respective resistor 411-1 through 411-5. The resistors 410-1 through 410-5 and the resistors 411-1 through 411-5 reduce the peak current of the phase buffer 302 in response to the phase B signal line 404 and the phase signal line 406, respectively.

Each driving stage circuit 402-1 through 402-6 comprises PMOS transistors 412, 414 and NMOS transistors 416, 418. The PMOS transistors 412 and 414 each include drain-source terminals coupled between a power line and the output signal line 408, and include a gate terminal coupled to the phase B signal line 404. The NMOS transistors 416 and 418 each include drain-source terminals coupled between the output signal line 408 and ground, and includes a gate terminal coupled to the phase signal line 406.

Figure 5:
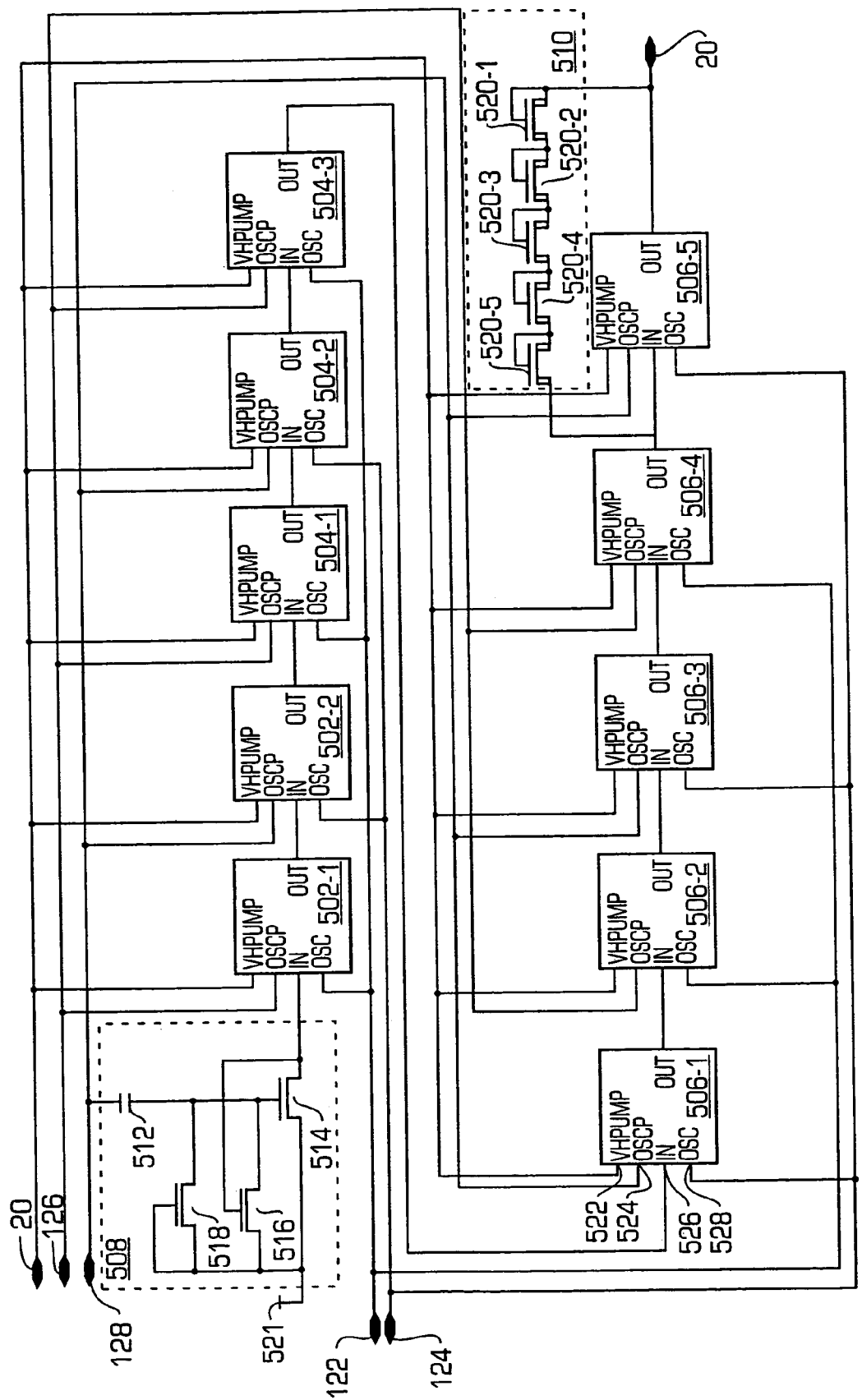

FIG. 5 is a schematic diagram illustrating a pump 106 of the charge pump 12. As an overview, the pump 106-1 through 106-4 is a Vt-cancellation pump with a powerup-assist diode and high voltage self-biasing. The pump 106 comprises a plurality of initial voltage boost stage circuit 502-1, 502-2, a plurality of intermediate voltage boost stage circuits 504-1, 504-2, and 504-3, a plurality of final voltage boost stage circuits 506-1 through 506-5, an input voltage boost stage 508, and a feedback circuit 510. For simplicity and clarify of the drawings, a power supply terminal 521 and input terminals 524, 526, 528 are labeled only for the final voltage boost stage 506-1, but the initial voltage boost stage circuits 502, the intermediate voltage boost stage circuits 504, and the final voltage boost stage circuits 506 each include terminals 522, 524, 526, 528. The non-overlapping clocks 116 and 118 enable the VT-cancellation in the voltage boost stages 504, 506 and 508.

The input voltage boost stage 508 selectively couples the supply voltage VDD on the power supply terminal 521 to the first initial voltage boost stage circuit 501-1. The output of the input voltage boost stage 508 is coupled to the input of the initial voltage boost stage circuit 502-1. The initial voltage boost stage circuit 502-1 and 502-2 are coupled in series, and in turn coupled to the intermediate voltage boost stage circuits 504-1, 504-2, 504-3, which are coupled in series. The final voltage boost stage circuit 506-1 through 506-5 are coupled in series and coupled to the intermediate voltage boost stage circuit 504-3.

The medium voltage pump (VMPUMP) signal 20 is applied to the input terminal 522 of each of the plurality of initial voltage boost stage circuits 502-1, 502-2, each of the plurality of intermediate voltage boost stage circuit 504-1, 504-2, and 504-3, and each of the plurality of final voltage boost stage circuits 506-1 through 506-5. The input terminal 122 and the input terminal 126 are coupled to an input terminal 528 and an input terminal 524, respectively, of the initial voltage boost stage 502-1, the intermediate voltage boost stage circuits 504-1, 504-3 and the final voltage boost stage circuits 506-2 and 506-4 to provide the respective first phase drive clock signal 112 and the first phase drive non-overlap clock signal 116. The input terminal 124 and the input terminal 128 are coupled to the respective input terminal 528 and the input terminal 524 of the initial voltage boost stage 502-2, the intermediate voltage boost stage circuit 504-2 and the final voltage boost stage circuits 506-1 and 506-3 to provide the respective second phase drive clock signal 114 and the second phase drive non-clock signal 118.

The input voltage boost stage 508 comprises a capacitor 512, a transfer NMOS transistor 514, a backward VT-canceling transistor 516, and a powerup assist and forward VT-canceling diode 518. The drain-source terminals of the transfer NMOS transistor 514 couple the power signal Vdd terminal 521 to the input of the initial voltage boost stage circuits 502-1. The power-up assist and forward VT-canceling diode 518 is coupled between the drain and the gate of the transfer NMOS transistor 514. In one embodiment, the diode 518 is a diode connected NMOS transistor. The drain-source terminals of the VT canceling transistor 516 couple the power supply Vdd to the gate of the transfer NMOS transistor 514. The forward VT-canceling of transistor 516 and/or backward VT-canceling action of diode 516 effectively cancel the effects of the threshold voltage of the transfer NMOS transistor 514.

The drain-source terminals of the NMOS transistor 514 couple the Vdd voltage terminal 521 signal to the input of the initial voltage boost stage 502-1. The drain-source terminals of the NMOS transistor 516 couple the Vdd voltage terminal 521 signal to the gate of the NMOS transistor 514. The gate of the NMOS transistor 516 is coupled to the source of the NMOS transistor 516. The drain-source terminals of the NMOS transistor 518 couple the Vdd voltage terminal 521 to the gate of the NMOS transistor 514. The gate of the NMOS transistor 518 is coupled to the Vdd voltage terminal 521. The capacitor 512 couples the second phase drive clock signal 118-1 to the gate of the NMOS transistor 514.

The feedback circuit 510 limits the voltage level of the high voltage pump signal 20 across the last stage 506 by feeding back the high voltage pump signal 20 into the input of the final voltage boost stage circuit 506-5. The feedback circuit 510 comprises NMOS transistors 520-1 through 520-5. The drain-source terminals of the NMOS transistors 520-1 through 520-5 are connected in series and connected between the high voltage pump (VHPUMP) signal 20, which is provided by an output terminal of the final voltage boost stage circuit 506-5, and the input terminal 526 of the final voltage boost stage circuit 506-5.

Figure 6:
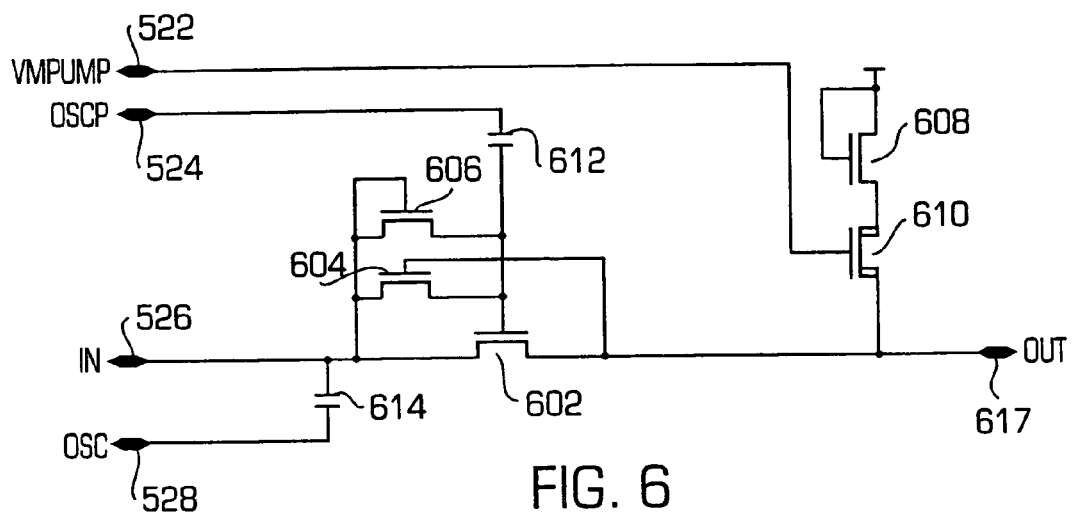
FIG. 6 is a schematic diagram illustrating an initial voltage boost stage circuit of the pump of FIG. 5.

FIG. 6 is a schematic diagram illustrating the initial voltage boost stage circuit 502 of the pump 106 of FIG. 5.

The initial voltage boost stage circuit 502 comprises NMOS transistors 602, 604, 606, 608, 610 and capacitors 612, 614. The drain-source terminals of the NMOS transistor 602 are coupled between the input terminal 526 and an output terminal 617 of the initial voltage boost stage circuit 502. The capacitor 614 is coupled between the input terminal 526 and the oscillator signal on the input terminal 528 (as shown in FIG. 5, the oscillator signal may be either the first phase drive non-overlap clock signal 116 or the second phase drive non-overlap clock signal 118). The NMOS transistor 604 includes drain-source terminals that are coupled between the drain and gate terminals of the NMOS transistor 602, and includes a gate coupled to the source of the NMOS transistor 602. The NMOS transistor 604 cancels the threshold voltage of the NMOS transistor 602. The NMOS transistor 606 includes drain-source terminals that are coupled between the drain and gate terminals of the NMOS transistor 602, and includes a gate coupled to the drain of the NMOS transistor 602. The NMOS transistor 606 operates as a powerup assist diode and provides forward VT-canceling to charge the stage using the voltage boost from the previous stage. The capacitor 612 is coupled between the gate of the NMOS transistor 602 and the oscillator signal on the input terminal 524 (as shown in FIG. 5, the oscillator signal may be either the first phase drive clock signal 112 or the second phase drive clock signal 114.

The output voltage on the output terminal 617 is precharged during power up by the NMOS transistors 608 and 610. The NMOS transistor 608 raises the breakdown voltage of the NMOS transistor 610, which self-biases the output voltage of the initial voltage boost stage circuit 502 using the medium pump signal 20. The NMOS transistor 608 includes a drain and a gate coupled together and to the power supply Vdd. The NMOS transistor 610 includes drain-source terminals coupled between the drain of the NMOS transistor 608 and the output terminal 617, and includes a gate biased by the medium pump (VMPUMP) signal 20. By using the medium pump signal 20, the pump output is fed back to the NMOS transistor 610. The voltage level of the medium pump signal 20 may be selected to prevent breakdown of the NMOS transistor 610.

Figure 7:
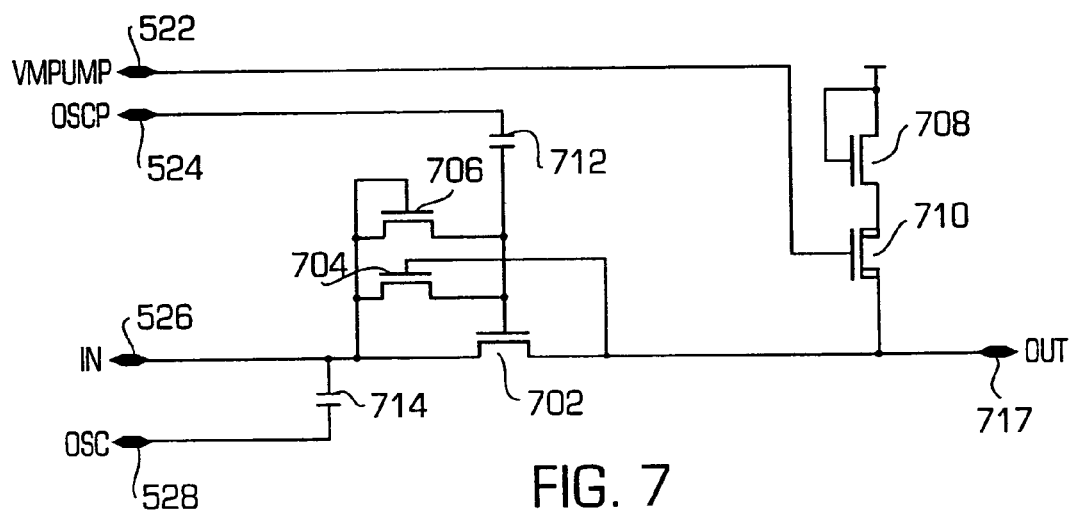
FIG. 7 is a schematic diagram illustrating an intermediate voltage boost stage circuit of the pump of FIG. 5.

FIG. 7 is a schematic diagram illustrating the intermediate voltage boost stage circuit 504 of the pump 106 of FIG. 5. The intermediate voltage boost stage circuit 504 is similar to the initial voltage boost stage circuit 502. The intermediate voltage boost stage circuit 504 comprises NMOS transistors 702, 704, 706, 708, 710 and capacitors 712, 714. The NMOS transistors 702, 704, 706, 708, 710 are coupled together in a manner similar to the respective NMOS transistors 602, 604, 606, 608, 610, but may have different electrical or physical characteristics than said respective NMOS transistors. Higher voltages are applied to the intermediate voltage boost stage circuit 504 than to the initial voltage boost stage circuit 502 so the NMOS transistors 702, 704, 706, 708, 710 operate at a higher voltage than the corresponding NMOS transistors in the initial voltage boost stage circuit 502. The capacitors 712, 714 are arranged in a manner similar to the respective capacitors 612, 614.

Figure 8:
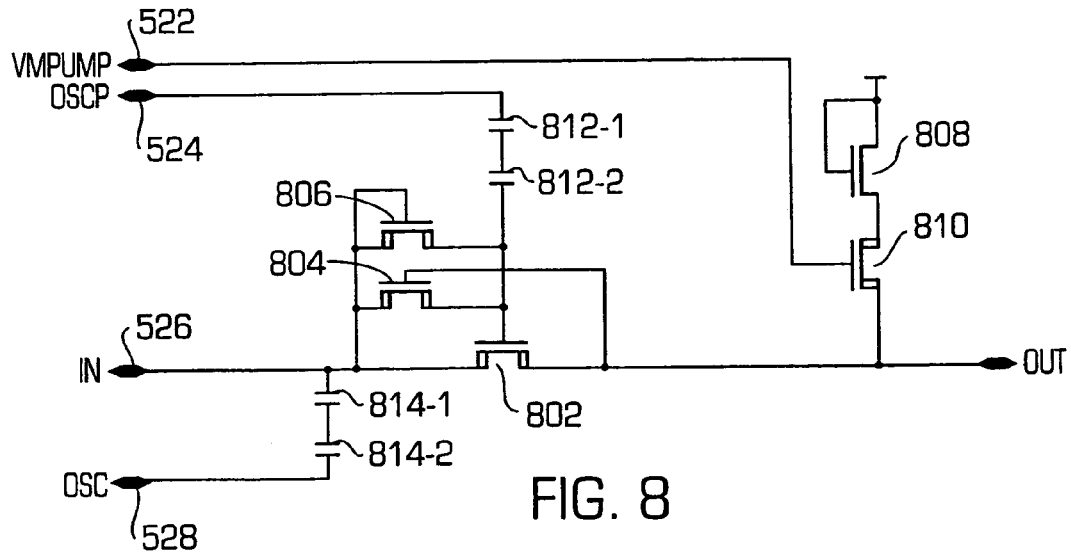
FIG. 8 is a schematic diagram illustrating a final voltage boost stage circuit of the pump of FIG. 5.

FIG. 8 is a schematic diagram illustrating a final voltage boost stage circuit 506 of the pump 106 of FIG. 5. The final voltage boost stage circuit 506 is similar to the initial voltage boost stage circuit 502 of FIG. 6. The final voltage boost stage circuit 506 comprises NMOS transistors 802, 804, 806, 808, 810 and capacitors 812, 814. The NMOS transistors 802, 804, 806, 808, 810 are coupled together in a manner similar to the respective NMOS transistors 602, 604, 606, 608, 610. The NMOS transistors 802, 804, 806, 808, 810 may have different electrical or physical characteristics than the respective NMOS transistors 602, 604, 606, 608, 610. Higher voltage levels are applied to the final voltage boost stage circuit 506 than to the stage circuits 502 and 504, so the NMOS transistors 802, 804, 806, 808, 810 operate at a higher voltage than the corresponding NMOS transistors in the initial voltage boost stage circuit 502 and the intermediate voltage boost stage circuits 504. The capacitors 812, 814 are arranged in a manner similar to the capacitors 612, 614. The capacitors 812, 814 each may be formed of more than one capacitor to reduce the breakdown voltage.

Figure 9:
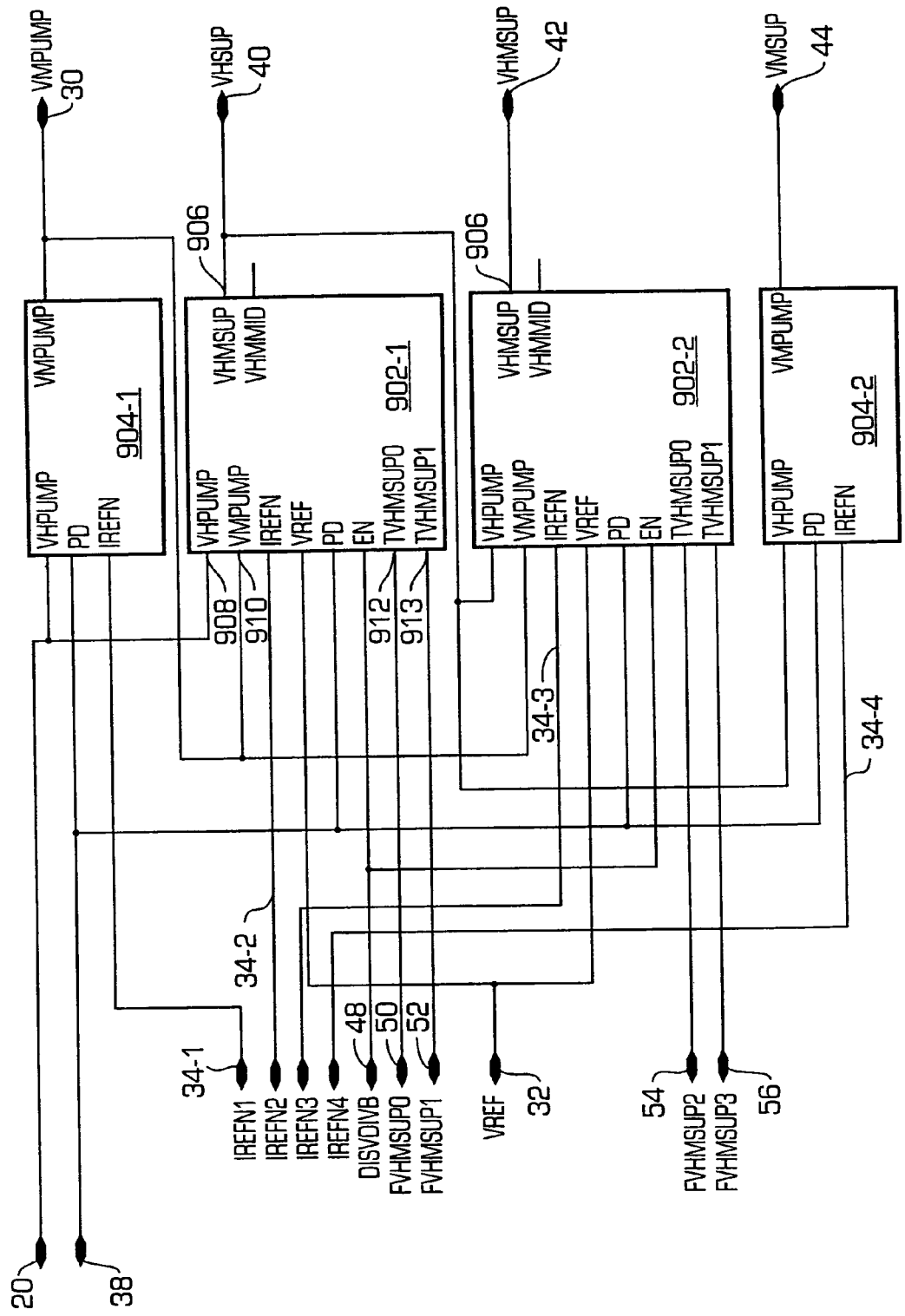
FIG. 9 is a schematic diagram illustrating a pump regulator of the high voltage generation and regulation system of FIG. 1.

FIG. 9 is a schematic diagram illustrating a pump regulator 14 of the high voltage generation and regulation system 10 of FIG. 1. The pump regulator 14 comprises high medium supply (VHMSUP) voltage regulators 902-1 and 902-2 and medium voltage (VM) pump generators 904-1 and 904-2.

The pump regulator 14 is a high voltage series regulator with slew rate enhancement and trimmable diode regulation. As an overview, the pump regulator 14 regulates multiple levels of voltage using a high voltage operational amplifier 1008 (see FIG. 10) with a trimmable diode regulation feedback loop, and a slew enhancement circuit that provides high speed power up without consuming additional power from the charge pump 12. A band gap reference signal is fed into the circuit, and compared to the feedback from a trimmable diode chain [see FIG. 12). The diode chain provides feedback in the regulator and is trimmed by a multiplexer 1204 (see FIG. 12) which shunts out a number of diodes to achieve a different feedback ratio. The output of the operational amplifier 1008 controls the current through the two series devices. The slew rate (rise time to power up) of the regulated level is slow because power through the operational amplifier 1008 is supplied from the limited power available from the charge pump 12. Thus, a slew rate enhancement circuit increases the slew rate by boosting the operational amplifier output to just below the regulated level, where the regulator can then assumes control of the regulation level.

The high medium supply (VHMSUP) voltage regulator 902-1 generates the high voltage supply (VHSUP) signal 40 at an output terminal 906 in response to the high voltage pump (VHPUMP) signal 20 applied to a high voltage input terminal 908 and the medium voltage pump (VMPUMP) signal 30 applied to a medium voltage input terminal 910. The third reference (IREFN2) signal 34-2 adjusts biases in the high medium supply (VHMSUP) voltage regulator 902-1. The reference voltage (VREF) signal 32 provides a reference for regulating the output voltage. The first voltage selection (FVHMSUP0) signal 50 and the second voltage selection (FVHMSUP1) signal 52 are applied to multiplexer control terminals 912 and 913, respectively, to control internal feedback of the high voltage supply signal 40 for comparison to the reference voltage (VREF) signal 32. The power down (PD) signal 38 disables the high medium supply (VHMSUP) voltage regulators 902-1 and 902-2 and the medium voltage pump generators 904-1 and 904-2.

The medium high voltage supply (VHMSUP) regulator 902-2 generates the medium high voltage supply (VHMSUP) signal 42 at an output terminal 906 in response to the high voltage pump (VH) pump signal 20 being applied to a high voltage input terminal 908 and the medium voltage pump (VMPUMP) signal 30 being applied to a medium voltage input terminal 910. (For simplicity and clarity, the terminals 908, 910, 912, and 913 are not labeled in FIG. 9 for the regulator 902-2.) The third reference (IREFN3) signal 34-3 adjusts biases in the high medium supply (VHMSUP) voltage regulator 902-2. The reference voltage (VREF) signal 32 provides a reference for regulating the medium high voltage supply (VHMSUP) signal 42. The third voltage selection (FVHMSUP2) signal 54 and the fourth voltage selection (FVHMSUP3) signal 56 are applied to the multiplexer control terminals 912 and 913, respectively, to control the internal feedback of the medium high voltage supply (VHMSUP) signal for comparison to the reference voltage (VREF) signal 32.

The medium voltage pump generator 904-1 generates the medium voltage pump (VMPUMP) signal 30 in response to the high voltage pump (VHPUMP) signal 20. The third reference (IREFN1) signal 34-1 biases the medium voltage pump generator 904-1 to adjust the medium voltage pump (VMPUMP) signal 30. The medium voltage pump generator 904-2 generates the medium voltage supply (VMSUP) signal 44 in response to the high voltage (VHSUP) signal 40. The third reference (IREFN4) signal 34-4 biases the medium voltage pump generator 904-2 to adjust the medium voltage supply (VMSUP) signal 44.

Figure 10:
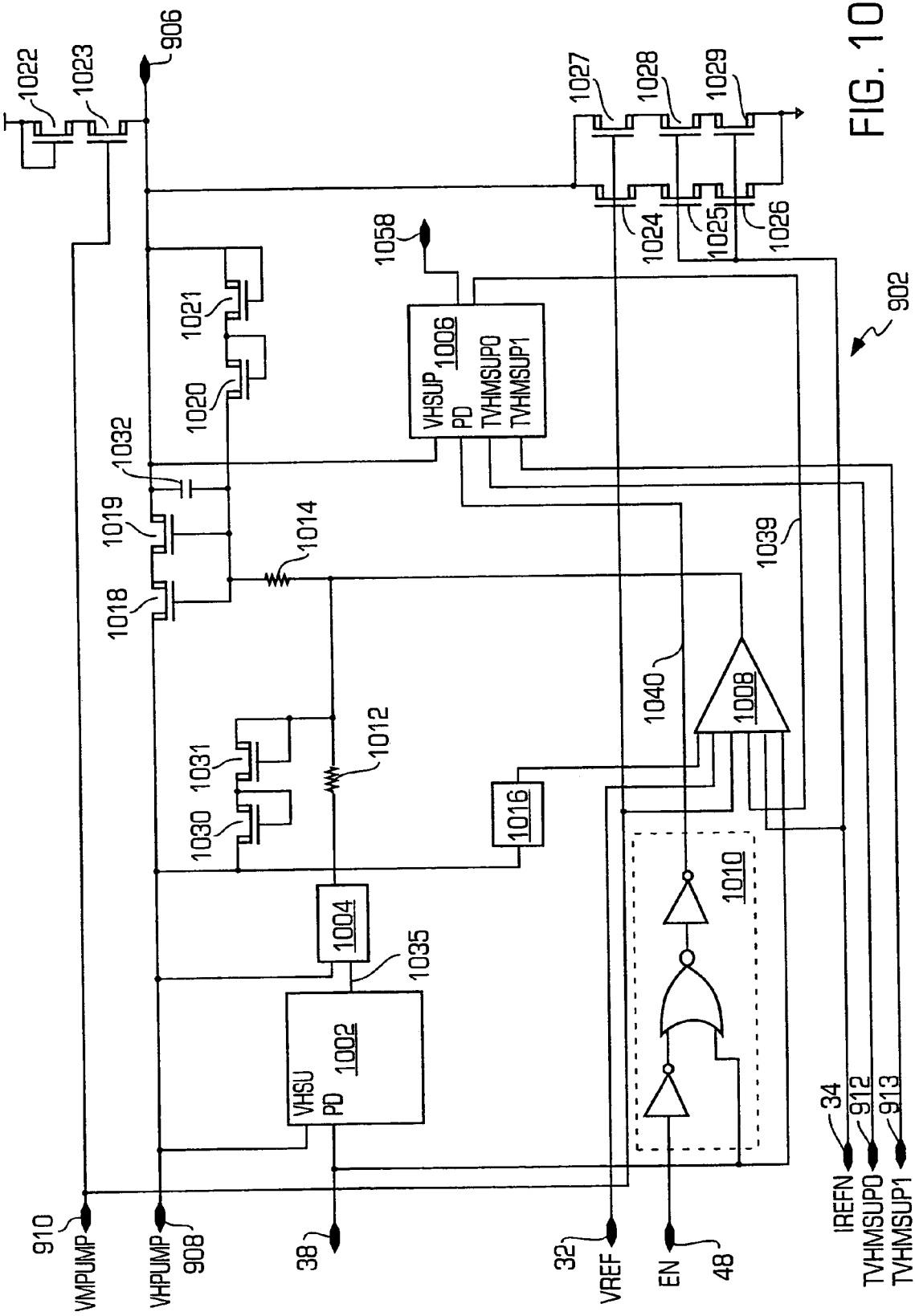
FIG. 10 is a schematic diagram illustrating a high medium supply (VHMSUP) voltage regulator of the pump regulator of FIG. 9.

FIG. 10 is a schematic diagram illustrating the high medium supply (VHMSUP) voltage regulator 902 of the pump regulator of FIG. 9. The high medium supply (VHMSUP) voltage regulator 902 comprises a high medium (VHM) voltage divider 1002, an output boost circuit 1004, a high voltage divider 1006, an operational amplifier 1008, a power down circuit 1010, a plurality of resistors 1012, 1014, a resistor-capacitor filter 1016, a plurality of NMOS transistors 1018 through 1031, and a capacitor 1032.

The voltage regulators 902-1 and 902-2 provides a high voltage supply signal 40 and a medium high voltage supply signal 42, respectively, as described above in conjunction with FIG. 9, at the output terminal 906. In one embodiment, both voltage regulators 902-1 and 902-2 have similar circuits. For the sake of simplicity and clarity, the voltage regulator 902 of FIG. 10 is described with respect to the voltage regulator 902-1 and its associated input and output signals.

The drain-source terminals of the NMOS transistors 1018 and 1019 are coupled in series between the input terminal 908, which for the voltage regulator 902-1 receives the high voltage pump (VHPUMP) signal 240, and the output terminal 906 to regulate the output voltage. The gates of the NMOS transistors 1018 and 1019 are coupled together. Although two NMOS transistors 1018 and 1019 are shown, more or fewer transistors may be included to adjust the regulation or provide voltage breakdown protection.

The NMOS transistors 1020 and 1021 are diode connected and coupled in series between the output terminal 906 and the common node formed of the gates of the NMOS transistors 1018 and 1019 to prevent overshoot on the output terminal 906. The capacitor 1032 is coupled between the source of the NMOS transistor 1019 and the common node formed of the gates of the NMOS transistors 1018 and 1019 to filter noise.

The operational amplifier 1008 provides feedback to control the current of the NMOS transistors 1018 and 1019. The output of the operational amplifier 1008 is coupled through the resistor 1014 to the common node formed of the gates of the NMOS transistors 1018 and 1019. The output of the output boost circuit 1004 is coupled through the series connected resistors 1012 and 1014 to the gates of the NMOS transistors 1018, 1019 for slew rate enhancement. The output boost circuit 1004 boosts the output of the operational amplifier 1008 at power up to slew the output to a controlled level after which the operational amplifier 1008 assumes control of the voltage regulation. The output boost circuit 1004 provides the slew rate control output in response to a divided voltage signal 1035 from the high voltage divider 1002, which divides the high voltage pump signal as applied to the input terminal 908. The power down signal 38 powers down the high voltage divider 1002.

Figure 11:
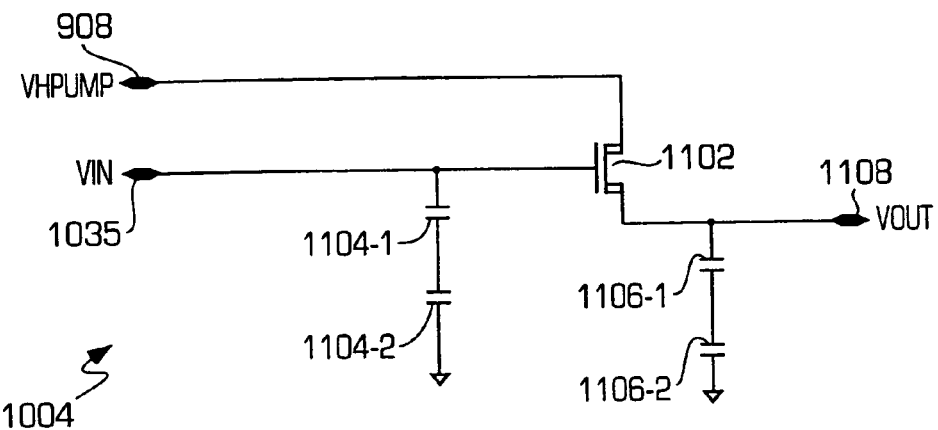
FIG. 11 is a schematic diagram illustrating an output boost circuit of the high medium supply (VHMSUP) voltage regulator of FIG. 10.

FIG. 11 is a schematic diagram illustrating the output boost (OTA_boost) circuit 1004 of the high medium supply (VHMSUP) voltage regulator 902 of FIG. 10.

The output boost circuit 1004 is a source-follower connected device controlled by the high voltage divider 1002. The output boost circuit 1004 comprises an NMOS transistor 1102, capacitors 1104-1, 1104-2, capacitors 1106-1, 1106-2, and an output voltage terminal 1108. The capacitors 1104-1 and 1104-2 are series connected between the gate of the NMOS transistor 1102 and ground. The capacitors 1106-1 and 1106-2 are series connected between the source of the NMOS transistor 1102 and ground. The capacitors 1106-1 and 1106-2 may function as compensation capacitors for the operational amplifier 1008. Although two capacitors 1104 and two capacitors 1106 are shown, fewer or more capacitors may be used depending on device characteristics for avoiding voltage breakdown. For the voltage regulator 902-1, the high voltage (VHPUMP) pump signal 20 is applied to the high voltage input terminal 908 and thus applied to the drain of the NMOS transistor 1102. For the voltage regulator 902-2, the high voltage supply signal 40 is applied to the high voltage input terminal 908. The divided voltage signal 1035 is applied to the gate of the NMOS 1102. The output voltage terminal 1108 provides an output that follows the voltage applied to the gate of the NMOS transistor 1102.

Referring again to FIG. 10. In response to the divided voltage signal 1035, the output boost circuit 1004 charges at power up the output of the operational amplifier 1008. The voltage level of the divided voltage signal 1035 from the high voltage divider 1002 is adjusted so that it slews up to a little below, e.g., a few hundred millivolts, the regulated voltage level, at such level the operational amplifier 1008 takes over the feedback control.

The drain-source terminals of the NMOS transistors 1030 and 1031 are coupled in series between the output of the operational amplifier 1008 and the common node formed of the input terminal 908 and an input terminal of the filter 1016. In one embodiment the filter 1016 is made of an R-C filter. In another embodiment the filter 1016 is made of D-C filter, i.e., a diode connected transistor functions as a resistor R. The NMOS transistors 1030 and 1031 are each diode connected to prevent overshoot on the output of the operational amplifier 1008. The output of the resistor-capacitor filter 1016 is coupled to a high voltage supply terminal of the operational amplifier 1008. The resistor-capacitor filter 1016 filters the noise on the high voltage power applied to the operational amplifier 1008 to improve the power supply rejection ratio.

The feedback voltage divider 1006 provides a feedback divided voltage signal 1039 to the operational amplifier 1008 in response to the output signal on the output terminal 906 and first and second voltage selection signals 1042 and 1044, respectively. For the voltage regulator 902-1, the first and second voltage selection signals 1042 and 1044 are the first and second voltage selection signals 50 and 52, respectively. For the voltage regulator 902-2, the first and second voltage selection signals 1042 and 1044 are the third and fourth voltage selection signals 54 and 56, respectively. The feedback voltage divider 1006 also provides a divided voltage signal 1038 that can be used as another regulated high voltage. A power down signal 1040 from the power down circuit 1010 turns off the feedback voltage divider 1006. The power down circuit 1010 provides the power down signal 1040 in response to the power down signal 38 and the enable signal 48.

Figure 12:
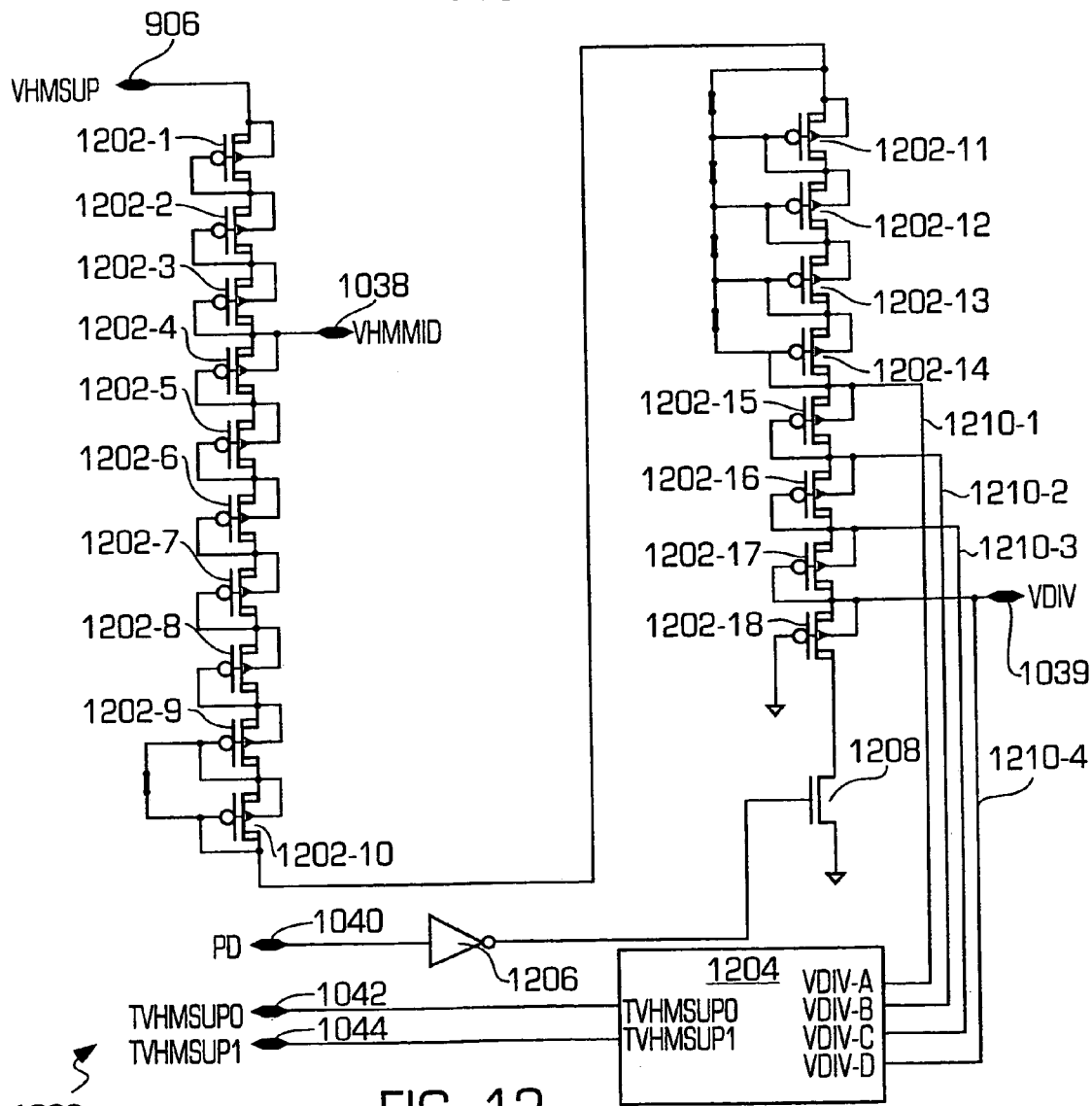
FIG. 12 is a schematic diagram illustrating a feedback voltage divider of the voltage regulator of FIG. 10.

FIG. 12 is a schematic diagram illustrating the feedback voltage divider 1006 of the voltage regulator 902 of FIG. 10. The feedback voltage divider 1006 comprises a plurality of PMOS transistors 1202-1 through 1202-18, a voltage divider multiplexer 1204, an inverter 1206 and an NMOS transistor 1208.

The drain-source terminals of the PMOS transistors are series coupled between the output terminal 906, which receives either the high voltage supply signal 40 or the medium high voltage supply signal 42, and the drain of the NMOS transistor 1208. Because the drain of the NMOS transistor 1208 is connected to the drain of the PMOS transistor 1202-18, its drain to source voltage variation has little or no influence to the voltage on node 1039, which depends mainly on gate to source voltage of the transistor 1202-18. Hence the transistor 1208 contributes little or no error in the regulation. The source of the NMOS transistor 1208 is coupled to ground. The output of the inverter 1206 is coupled to the gate of the NMOS transistor 1208 for controlling the NMOS transistor 1208 in response to the power down signal 1040. The divided voltage signal terminal 1038 is coupled to the drain of the PMOS transistor 1202-3. In another embodiment, the divided voltage signal terminal 1038 may be coupled to another PMOS transistor 1202 in order to provide a different divided voltage. The feedback divided voltage signal 1039 is provided by the drain of the PMOS transistor 1202-17. Trim connections between selected ones of the series connected PMOS transistors 1202 may be included for adjusting the voltage on the divided voltage signal terminal 1038 and the feedback divided voltage signal 1039. The inverter 1206 applies an inversion of the power down signal 1040 to the gate of the NMOS transistor 1208 to turn off the NMOS transistor 1208 and the feedback voltage divider 1006 during power down. The voltage divider multiplexer 1204 has four multiplexer selected outputs 1210-1 through 1210-4 connected to the drains of the PMOS transistors 1202-14 through 1202-17, respectively. The voltage divider multiplexer 1204 controls the PMOS transistors 1202-14 through 1202-17 in response to the first and second voltage selections signals applied to the multiplexer control terminals 912 and 913. In another embodiment, another PMOS transistor 1202 provides the feedback divided voltage signal 1039 and the multiplexer selected outputs 1210 may be connected to other PMOS transistors 1202.

Figure 13:
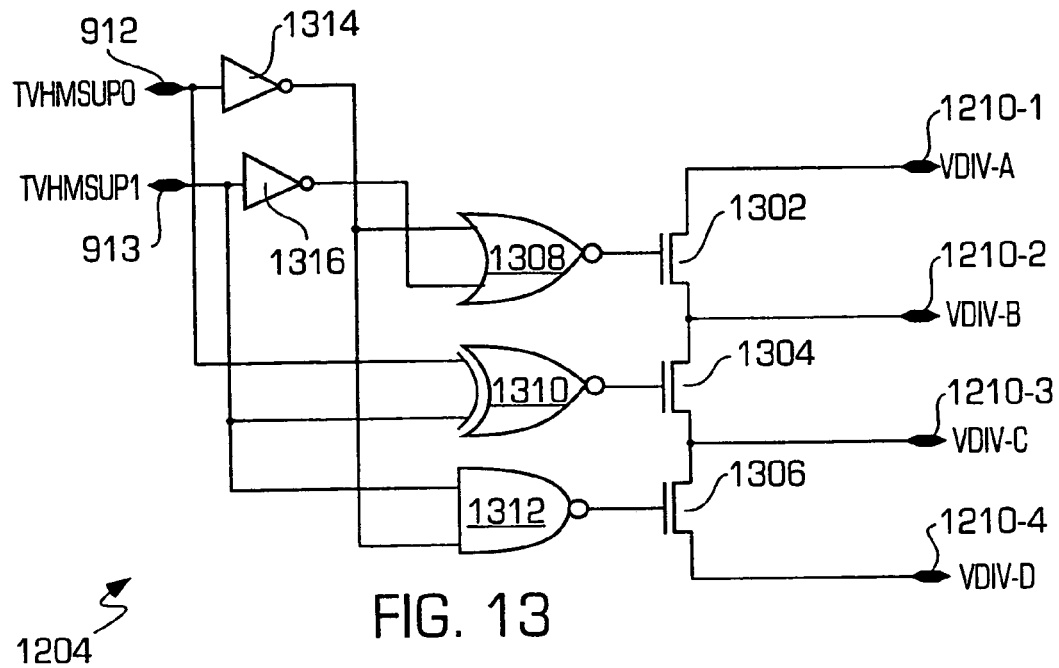
FIG. 13 is a schematic diagram illustrating a voltage divider multiplexer of the feedback voltage divider of FIG. 12.

FIG. 13 is a schematic diagram illustrating a voltage divider multiplexer 1204 of the feedback voltage divider 1006 of FIG. 12. The voltage divider multiplexer 1204 comprises a plurality of NMOS transistors 1302, 1304, 1306, a NOR gate 1308, an exclusive NOR gate 1310, a NAND gate 1312, and a plurality of inverters 1314, 1316. The drain-source terminals of the NMOS transistors 1302, 1304, 1306 are coupled in series to form the first voltage selection signal (VDIV_A) 1210-1 at the drain terminal of the NMOS transistor 1302, a second voltage selection signal (VDIV_B) signal 1210-2 at the drain of the NMOS transistor 1304, a third voltage selection signal (VDIV_C) 1210-3 at the drain of the NMOS transistor 1306, and a fourth voltage selection signal (VDIV_D) 1210-4 at the source of the NMOS transistor 1308. The outputs of the NOR gate 1308, the exclusive NOR gate 1310 and the NAND gate 1312 are coupled to the gate of the respective NMOS transistor 1302, 1304 and 1306, and coupled together with the inverters 1314, 1316 to form the selection logic for turning on and off the NMOS transistors 1302, 1304, and 1306 in response to the voltage selection signals applied to the multiplexer control terminals 912 and 913.

Refer again to FIG. 10. The feedback divided voltage 1039 is applied to the operational amplifier 1008 and compared to the reference voltage 32. The operational amplifier 1008 receives the high voltage from the high voltage input terminal 908, which is filtered by the filter 1016, as an operational voltage. The operational amplifier 1008 also is biased by the third reference (IREFN) signal 34.

The output voltage on the output terminal 906 is pre-charged during power up by the NMOS transistors 1022 and 1023. The output terminal 906 is self-biased by the NMOS transistor 1023, which is biased by the medium voltage pump signal 30 applied to a gate thereof. The NMOS transistors 1022 and 1023 include drain-source terminals coupled between the supply voltage and the output terminal 906. The NMOS transistor 1022 is diode connected. The NMOS transistor 1022 raises the breakdown voltage of the NMOS transistor 1023. By using the medium voltage pump signal 30, the regulator output is fed back to the NMOS transistor 1023. The voltage level of the medium pump signal 30 may be selected to prevent voltage breakdown when the regulator is fully powered up.

The NMOS transistor 1024 and the NMOS transistor pair 1025 and 1026 are coupled together as a cascode between the output terminal 906 and ground. The gates of the NMOS transistors 1025 and 1026 are coupled together and biased by the third reference (IREFN) signal 34. The NMOS transistor 1024 is biased by the medium voltage signal 30 applied to the medium voltage input terminal 910. The NMOS transistors 1027, 1028 and 1029 are coupled together in a similar manner as the respective NMOS transistors 1024, 1025 and 1026 and selectively coupled in parallel to the NMOS transistors 1024, 1025 and 1026.

Refer again to FIG. 1. The loop regulator 16 generates the enable (ENB) signal 28 to control the charge pump 12 based on the pre-regulated output of the charge pump 12.

Figure 14:
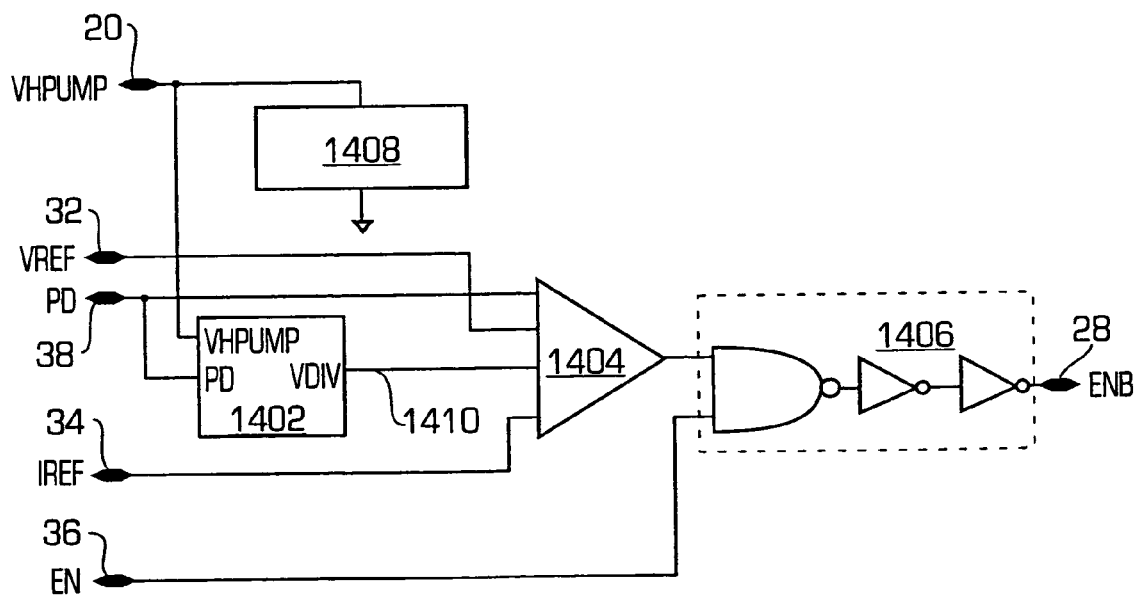
FIG. 14 is a schematic diagram illustrating a loop regulator of the high voltage generator and regulation system of FIG. 1.

FIG. 14 is a schematic diagram illustrating the loop regulator 16 of the high voltage generation and regulation system 10. The loop regulator 16 comprises a loop voltage divider 1402, a comparator 1404, a NAND circuit 1406, and a pool capacitor 1408. The loop regulator 16 provides a nested loop within a larger regulation loop of the pump regulator 14 and the charge pump 12 to control the charge pump 12 by enabling and disabling the oscillator 102 based on the pre-regulated output (high voltage pump signal 20) of the charge pump 12. This output can then be fed into the larger regulation loop for supplying multiple voltage levels to the external device. The nested loop regulation controls breakdown, and also functions by using the comparator 1404 with the inputs from a band gap reference voltage (not shown) and the loop voltage divider 1402 for feedback. Based on the comparison, the output of the charge pump 12 is controlled by enabling or disabling the oscillator 102.

The loop voltage divider 1402 divides the high voltage pump (VHPUMP) signal 20 from the charge pump 12 to generate a divided voltage signal 1410, which is applied to the comparator 1404. The loop voltage divider 1402 may be, for example, a voltage divider 1518 (see FIG. 16). The pool capacitor 1408 couples the high voltage pump (VHPUMP) signal 20 to ground to filter ripple on the high voltage pump signal 20. The loop voltage divider 1402 and the comparator 1404 are disabled by the power down (PD) signal 38. The third reference (IREFN3) signal 34 controls the biasing of the comparator 1404. The comparator 1404 generates a signal to disable the output of the charge pump 12 in the event that the divided voltage signal 1410 is greater than the reference voltage (VREF) 32 applied to the comparator 1404. The NAND circuit 1406 generates the enable (ENB) signal 28 in response to both the output of the comparator 1404 and the enable (EN) signal 36 being high.

Figure 15:
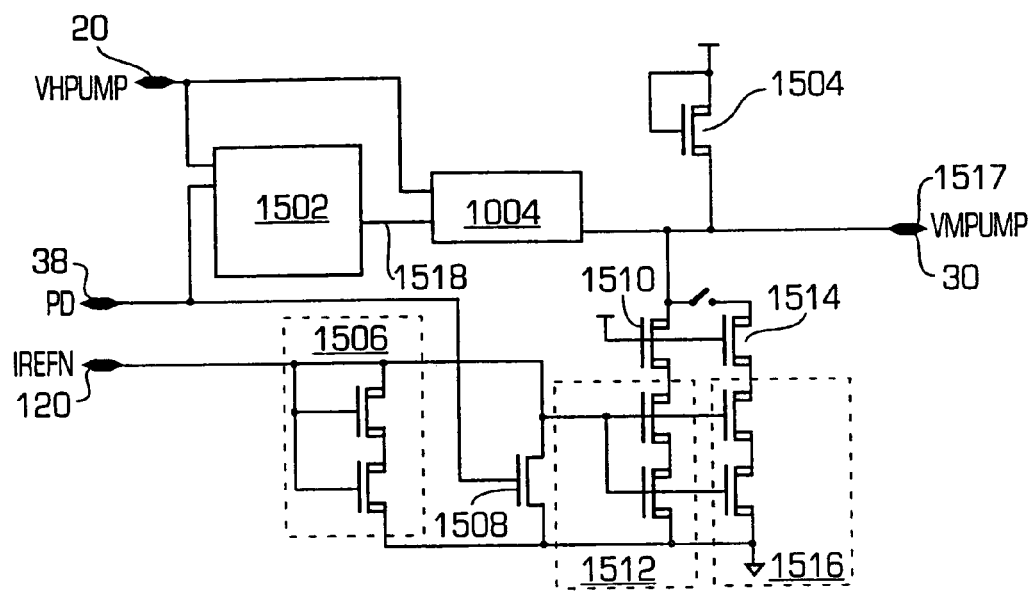

FIG. 15 is a schematic diagram illustrating the medium voltage pump generator 108 of the charge pump 12 of FIG. 1a. The VM pump generator 108 comprises a pump medium voltage divider (vdivider_vmpump) 1502, an output boost (OTA_boost) circuit 1004, a NMOS transistor 1504, an NMOS transistor pair 1506, NMOS transistors 1508, 1510, an NMOS transistor pair 1512, an NMOS transistor 1514, and an NMOS transistor pair 1516.

The output boost circuit 1004 (described above in conjunction with FIG. 10) is a source-follower device. The output boost circuit 1004 provides the medium voltage pump signal at an output terminal 1517, which is coupled to the source terminal of the NMOS transistor 1504 and to the drain terminals of the NMOS transistors 1510, 1514. Biasing of the NMOS transistor 1102 (see FIG. 11) in the output boost circuit 1004 is controlled by a divided voltage signal 1518 from the medium voltage pump voltage divider 1502.

Figure 16:
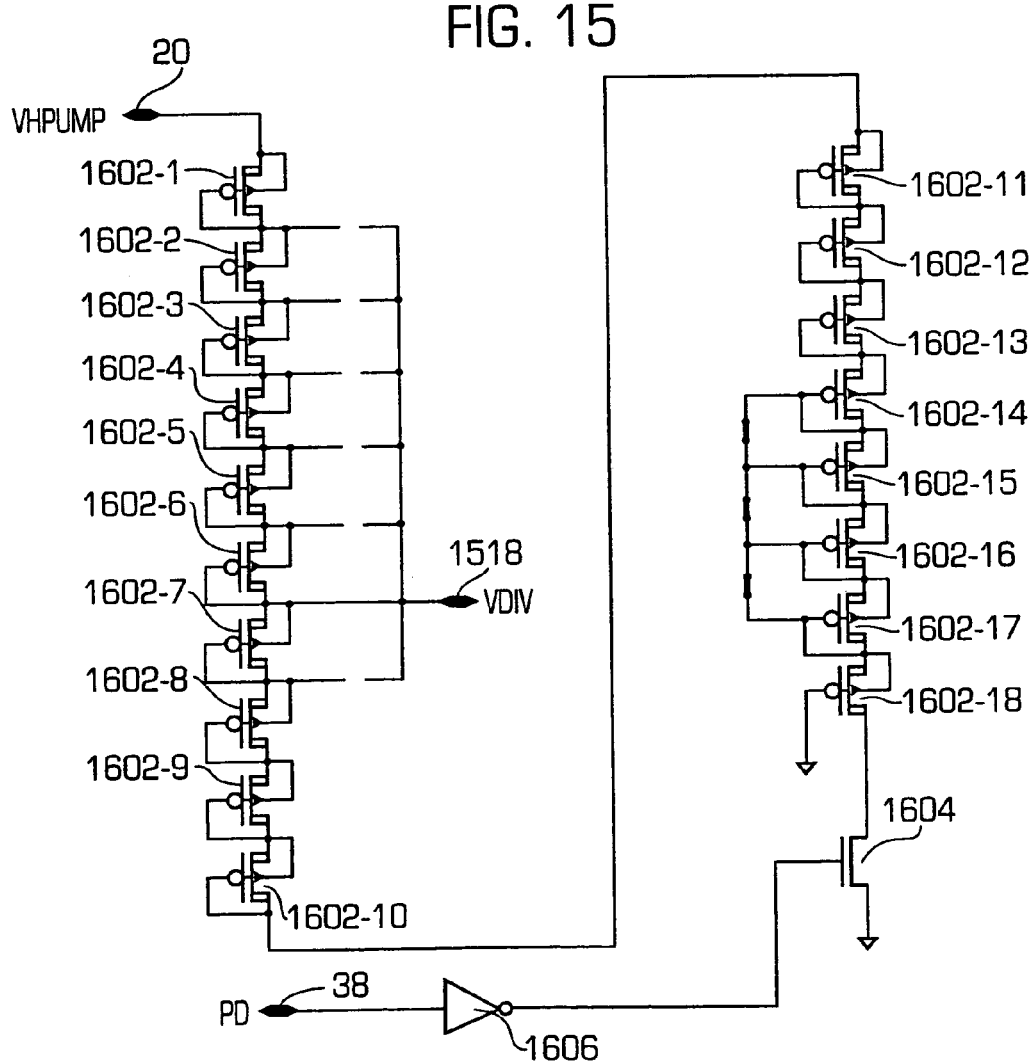
FIG. 16 is a schematic diagram illustrating a medium voltage pump voltage divider of the medium voltage pump generator of FIG. 15.

FIG. 16 is a schematic diagram illustrating the medium voltage pump voltage divider 1502 of the medium voltage pump generator 108. The pump medium voltage divider 1502 comprises PMOS transistors 1602-1 through 1602-18, an NMOS transistor 1604, and an inverter 1606. The PMOS transistors 1602-1 through 1602-18 each include a bulk that is coupled to its source. The PMOS transistors 1602-1 through 1602-17 each include a gate that is coupled to its drain. The PMOS transistor 1602-18 includes a gate coupled to ground. The drain-source terminals of the PMOS transistors 1602-1 through 1602-18 are coupled in series between the high voltage pump (VHPUMP) signal 20 and a drain of the NMOS transistor 1604. The source of the NMOS transistor 1604 is coupled to ground. The inverter 1606 inverts the power down signal 38 and applies the inverted signal to the gate of the NMOS transistor 1604 to turn off the NMOS transistor 1604 and the voltage divider 1502 during power down. Turning off the NMOS transistor 1604 at power down controls the voltages on the PMOS transistors 1602 to prevent high voltage breakdown. In one embodiment, the divided voltage signal 1518 is provided from the drain of the PMOS transistor 1602-6. The number of PMOS transistors 1602 may be changed to adjust the voltage of the divided voltage signal 1518. In one embodiment, some of the PMOS transistors 1602 may be selected by trimming trace connections on the device that short the sources of some of the PMOS transistors 1602 together. For illustrative purposes, the PMOS transistors 1602-14 through 1602-17 have their sources shorted together.

Refer again to FIG. 15. The drain of the NMOS transistor 1510 is coupled to the common node of the source of the NMOS transistor 1504 and the medium voltage pump signal 30. The NMOS transistor pair 1512 comprises two NMOS transistors including drain-source terminals coupled together in series between the source of the NMOS transistor 1510 and ground, and including gate terminals coupled together. Similarly, the NMOS transistor pair 1516 includes two NMOS transistors having drain-source terminals coupled in series between the source of the NMOS transistor 1514 and ground and having gate terminals coupled together. The NMOS transistor 1508 includes drain-source terminals coupled between the common node formed of the gates of the NMOS transistor pairs 1512, 1516 and the fourth reference (IREFN) signal 120 and ground, and includes a gate coupled to receive the power down (PD) signal 38 to turn off the NMOS transistor pairs 1512 and 1514. The NMOS transistor pair 1506 includes two NMOS transistors with drain-source terminals connected in series and coupled between the fourth reference (IREFN) signal 120 and ground, and with a gate coupled together and to the fourth reference (IREFN) signal 120.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A ring oscillator comprising:
a plurality of first inverters coupled in series with an output of one first inverter coupled to the input of another first inverter to form a ring, each of said plurality of inverters providing a first inverted signal having characteristics dependent on an applied first bias current, one of said first inverters providing a first clock signal;
a plurality of first capacitors, each of said plurality of first capacitors being coupled to the output of a respective one of said plurality of first inverters;
a second inverter having an input coupled to the output of said one of said plurality of first inverter providing said first clock signal and having an output for providing a second clock signal having characteristics dependent on an applied second bias current, the ratio of first bias current to the second bias current being such to adjust the phase between the first and second clock signals to a pre-selected value; and
a second capacitor coupled to the output of the second inverter, the capacitance of each of the plurality of first capacitors being equal to the capacitance of the second capacitor.

2. The ring oscillator of claim 1 further comprising a phase driver circuit for generating first and second driver signals in response to the first and second clock signals, the first and second driver signals being nonoverlapping clock signals.

3. The ring oscillator of claim 1 further comprising a phase driver circuit for generating first and second driver signals in response to the first and second clock signals, the first and second driver signals being phased apart clock signals.

4. A ring oscillator, comprising:
a plurality of first inverters coupled in series with an output of one first inverter coupled to the input of another first inverter to form a ring, one of said first inverters providing a first clock signal;
a plurality of first capacitors, each of said plurality of first capacitors being coupled to the output of a respective one of said plurality of first inverters;
a second inverter having an input coupled to the output of said one first inverter providing said first clock signal and having an output for providing a second clock signal;
a second capacitor counted to the output of the second inverter, the ratio of a capacitance of the second capacitor to a capacitance of the first capacitors being such to adjust the phase between the first and second clock signals to a pre-selected value; and
a phase driver circuit for generating first and second driver signals in response to the first and second clock signals, the first and second driver signals being nonoverlapping clock signals.

5. A ring oscillator, comprising:
a plurality of first inverters coupled in series with an output of one first inverter coupled to the input of another first inverter to font a ring, one of said first inverters providing a first clock signal;

a plurality of first capacitors, each of said plurality of first capacitors being coupled to the output of a respective one of said plurality of first inverters;

a second inverter having an input coupled to the output of said one first inverter providing said first clock signal and having an output for providing a second clock signal;

a second capacitor coupled to the output of the second inverter, the ratio of a capacitance of the second capacitor to a capacitance of the first capacitors being such to adjust the phase between the first and second clock signals to a pre-selected value; and a phase driver circuit for generating first and second driver signals in response to the first and second clock signals, the first and second driver signals being phased apart clock signals.

* * * * *